(12) United States Patent
Ohno

(10) Patent No.: US 7,259,397 B2
(45) Date of Patent: Aug. 21, 2007

(54) SELF-SCANNING LIGHT-EMITTING ELEMENT ARRAY CHIP

(75) Inventor: Seiji Ohno, Osaka (JP)

(73) Assignee: Fuji Xerox Co., Ltd., Tokyo (JP)

(*) Notice: Subject to any disclaimer, the term of this patent is extended or adjusted under 35 U.S.C. 154(b) by 0 days.

(21) Appl. No.: 10/498,669

(22) PCT Filed: Dec. 10, 2002

(86) PCT No.: PCT/JP02/12896

§ 371 (c)(1),
(2), (4) Date: Jun. 10, 2004

(87) PCT Pub. No.: WO03/050888

PCT Pub. Date: Jun. 19, 2003

(65) Prior Publication Data

US 2005/0087748 A1    Apr. 28, 2005

(30) Foreign Application Priority Data

Dec. 13, 2001 (JP) ............................. 2001-379676
Nov. 26, 2002 (JP) ............................. 2002-341628

(51) Int. Cl.
H01L 33/00 (2006.01)
H01L 33/001 (2006.01)
H01L 25/028 (2006.01)

(52) U.S. Cl. .......................... 257/88; 257/94; 257/98; 257/99; 257/103

(58) Field of Classification Search .............. 257/81–2, 257/88–9, 98–100, 103, 432–3, 723, 72
See application file for complete search history.

(56) References Cited

U.S. PATENT DOCUMENTS

| 5,210,052 | A | * | 5/1993 | Takasaki .................. 438/509 |
| 5,451,767 | A | * | 9/1995 | Amano et al. ............ 250/214.1 |
| 5,451,977 | A | * | 9/1995 | Kusuda et al. ................ 345/44 |
| 6,271,051 | B1 | * | 8/2001 | Ogihara et al. ............... 438/45 |
| 6,589,335 | B2 |   | 7/2003 | Bulsara et al. |
| 6,825,500 | B1 |   | 11/2004 | Komaba |

FOREIGN PATENT DOCUMENTS

| CN | 1320279 A | 10/2001 |
| JP | 2-14584 | 1/1990 |
| JP | 2-92650 | 4/1990 |
| JP | 11-168236 | 6/1999 |
| JP | 11-284222 | 10/1999 |
| JP | 2000-183325 | 6/2000 |
| JP | 2001-244500 | 9/2001 |

* cited by examiner

OTHER PUBLICATIONS

S.K. Tewksbury, et al., Monolithic Cointegration of Optoelectronics with Silicon CMOS, West Virginia University, Dept. of Electrical and Computer Engineering, Morgantown, West Virginia.

G. Vanamu, et al. Characterization and analysis of heteroepitaxial growth on silicon structures, Microsc Microanal, Microscopy Society of America, 2003, pp. 372-373, vol. 9 (Suppl 2).

Z. Yu, et al., GaAs-Based Heterostructures on Silicon, Physical Sciences Research Labs- Motorola Labs, Tempe, Arizona.

Primary Examiner—Wai-Sing Louie
(74) Attorney, Agent, or Firm—RatnerPrestia

(57) ABSTRACT

Provided is a self-scanning light-emitting element array chip structured on a substrate using Si. A lattice mismatching buffer layer (32) is formed on a Si substrate (30). On the lattice mismatching buffer layer (32), successively stacked are an n-type AlGaAs layer (14), a p-type AlGaAs layer (16), an n-type AlGaAs layer (18), and a p-type AlGaAs layer (20) in this order. On the AlGaAs layer (20) provided is an anode electrode (22), on the AlGaAs layer (18) a gate electrode (24), on the bottom surface of the GaAs substrate a cathode electrode (26).

11 Claims, 9 Drawing Sheets

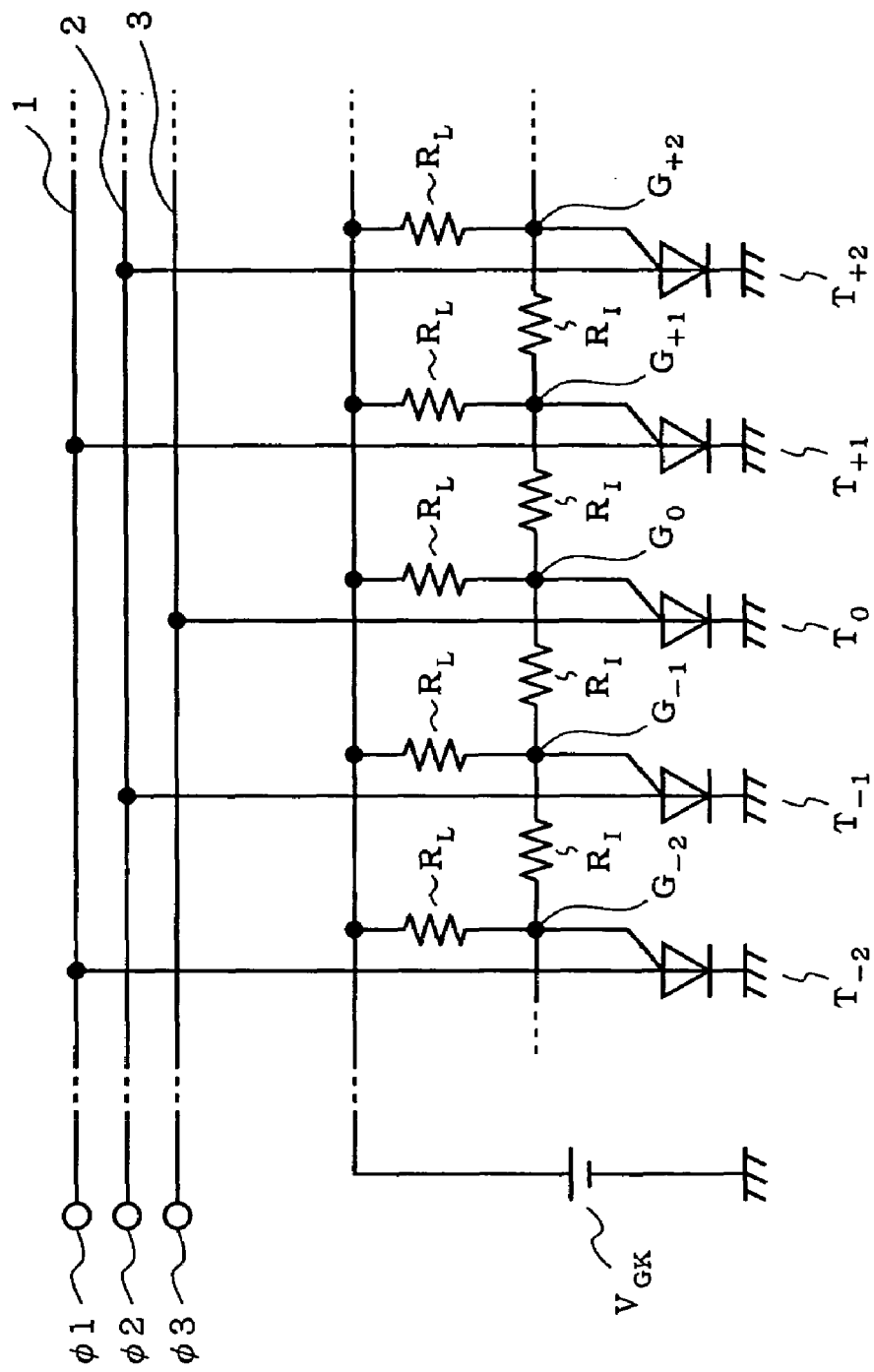
F I G. 2

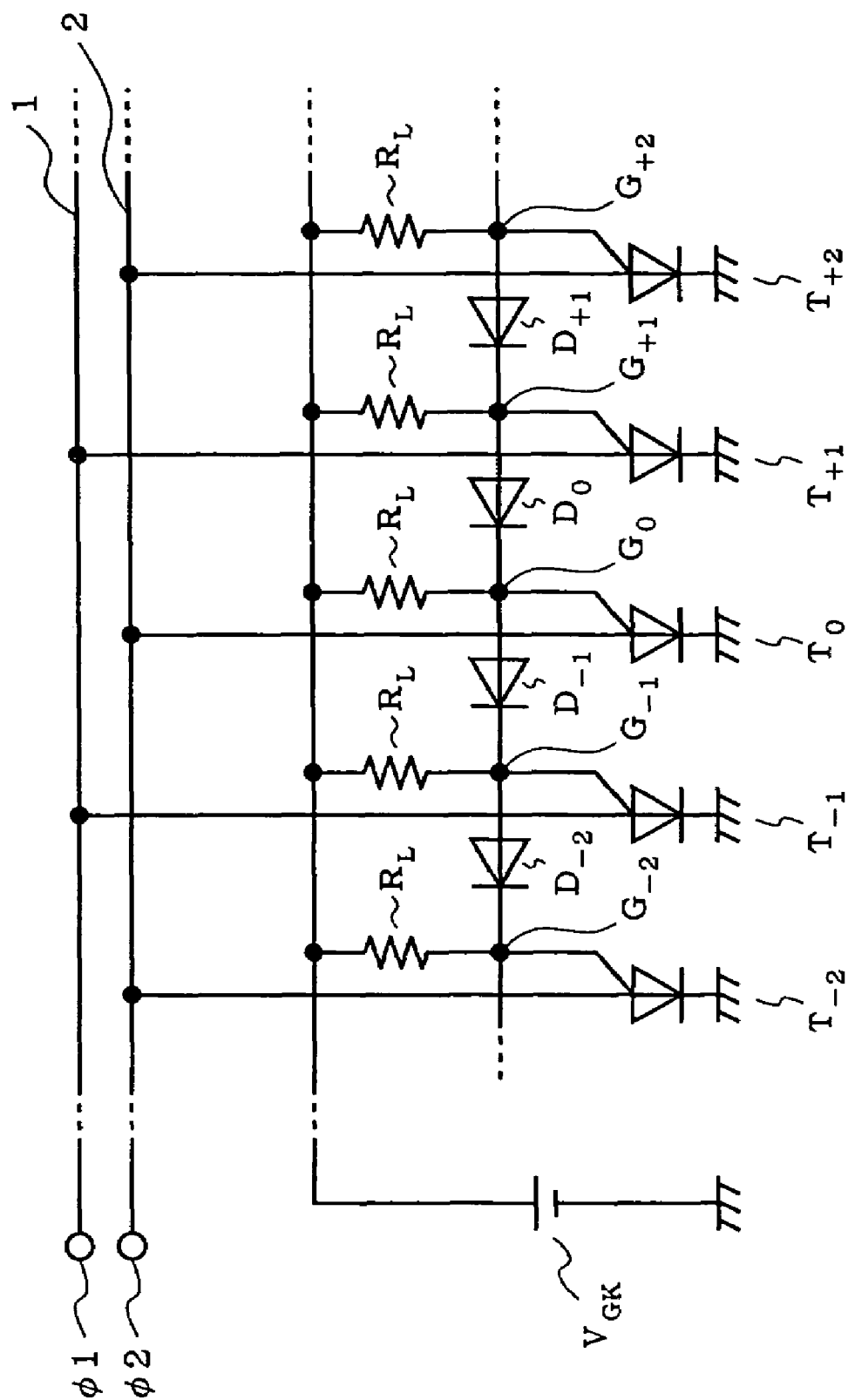
F I G. 3

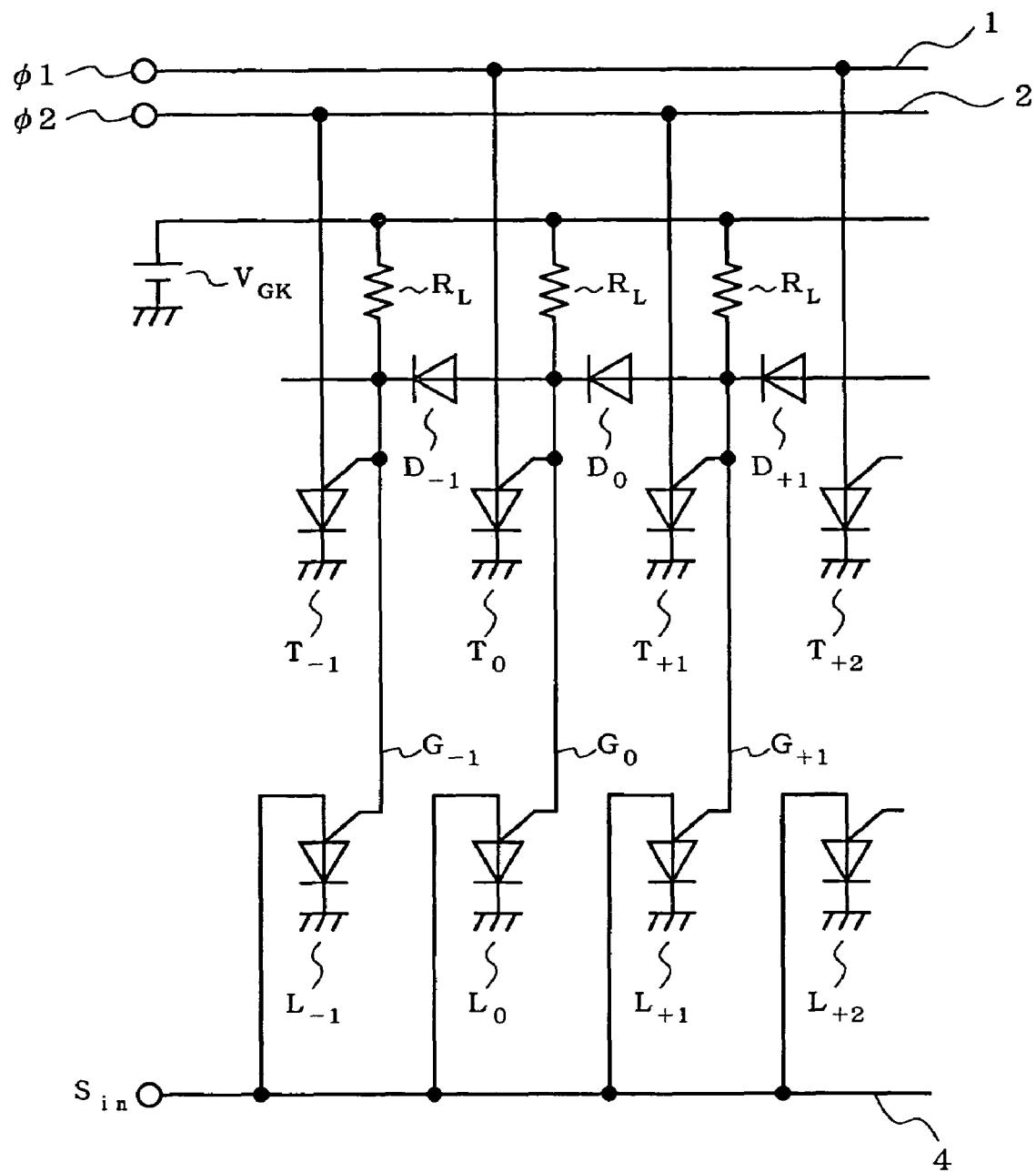
F I G . 4

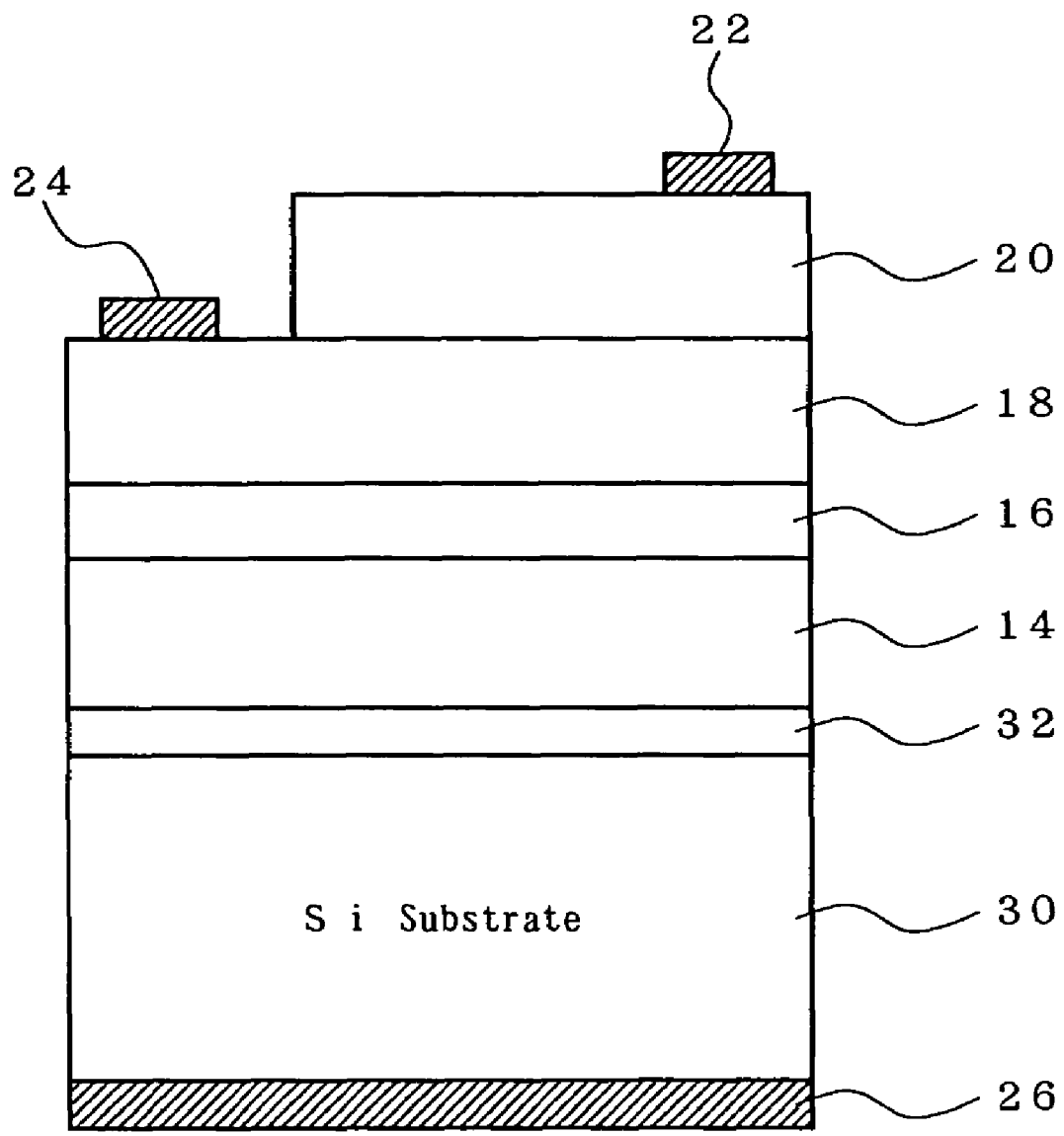
F I G. 5

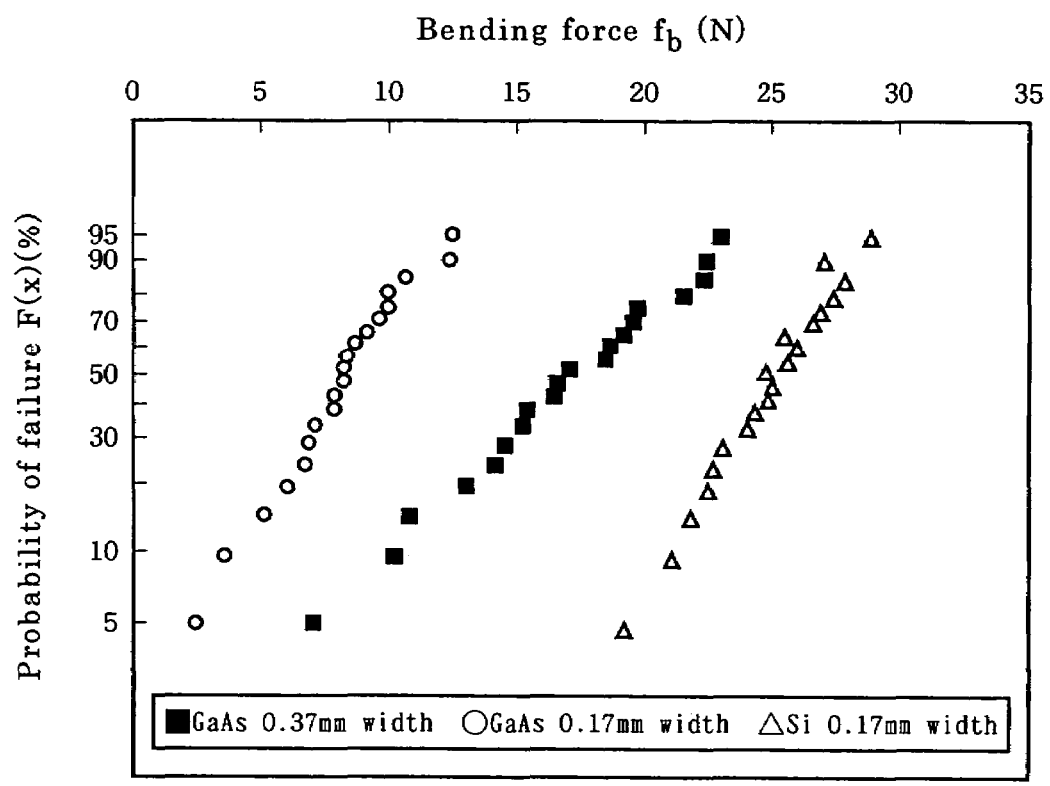
F I G . 6

SELF-SCANNING LIGHT-EMITTING ELEMENT ARRAY CHIP

TECHNICAL FIELD

The present invention generally relates to a self-scanning light-emitting element array chip, particularly to a self-scanning light-emitting element array chip formed on a Si substrate. The present invention further relates to an optical writing head using such self-scanning light-emitting element array chips and an optical printer.

BACKGROUND ART

In an LED (light-emitting diode) array consisting of arranged light-emitting elements, bonding pads used for bonding wires to a driver circuit are provided. The bonding pads used for wire bonding require larger area than that of light-emitting elements. As the number of light-emitting elements per unit length is increased for a high-density image, the number of bonding pads is also increased. If the area of a bonding pad is not changed for a high-density image, a problem is caused such that the size of an LED array chip is enlarged because the area occupied by the pads is increased.

In order to resolve the problem, the inventor of the present application has interested in a three-terminal light-emitting thyristor having a pnpn-structure as an component of a light-emitting element array, and has already proposed a self-scanning light-emitting element array for realizing a self-scanning function of light-emitting points (see Japanese Patent Publications Nos. 1-238962, 2-14584, 2-92650, and 2-92651. These patent publications have disclosed that self-scanning light-emitting arrays may be easily mounted for an optical writing head of an optical printer, the array pitch of light-emitting elements may be fined, a compact self-scanning light-emitting element array may be fabricated, and so on.

FIG. 1 is a schematic cross-sectional view depicting a fundamental structure of a light-emitting thyristor. As shown in FIG. 1, on an n-type GaAs substrate 10 successively stacked are an n-type GaAs buffer layer 12, an n-type AlGaAs layer 14, a p-type AlGaAs layer 16, an n-type AlGaAs layer 18, and a p-type AlGaAs layer 20. On the AlGaAs layer 20 provided is an anode electrode 22, on the AlGaAs layer 18 a gate electrode 24, on the bottom surface of the GaAs substrate 10 a cathode electrode 26.

In this example, an n-type layer, a p-type layer, an n-type layer, and a p-type layer are stacked in this order on an n-type GaAs substrate via a buffer layer. However, a p-type layer, an n-type layer, a p-type layer, and an n-type layer may be stacked in this order on a p-type GaAs substrate via a buffer layer, in this case the uppermost electrode is a cathode one, and the bottommost electrode is an anode one.

Three fundamental structures of a self-scanning light-emitting array to which the light-emitting thyristor described above can be applied will now be described.

FIG. 2 shows an equivalent circuit diagram of a first fundamental structure of the self-scanning light-emitting array. According to the structure, light-emitting thyristors . . . $T_{-2}$, $T_{-1}$, $T_0$, $T_{+1}$, $T_{+2}$ . . . are used as light-emitting elements, each of thyristors comprising gate electrodes . . . $G_{-2}$, $G_{-1}$, $G_0$, $G_{+1}$, $G_{+2}$ . . . , respectively. Supply voltage $V_{GK}$ is applied to all of the gate electrodes via a load resistor $R_L$, respectively. The neighboring gate electrodes are electrically connected to each other via a resistor $R_I$ to obtain interaction. Each of three transfer clock ($\phi 1$, $\phi 2$, $\phi 3$) lines 1, 2, 3 is connected to the anode electrode of each light-emitting thyristor at intervals of three elements (in a repeated manner).

The operation of this self-scanning light-emitting array will now be described. Assume that the transfer clock $\phi 3$ is at a high level, and the light-emitting thyristor $T_0$ is turned on. At this time, the voltage of the gate electrode $G_0$ is lowered to a level near zero volts due to the characteristic of the three-terminal light-emitting thyristor. Assuming that the supply voltage $V_{GK}$ is 5 volts, the gate voltage of each light-emitting thyristor is determined by the resistor network consisting of the load resistors $R_L$ and the interactive resistors $R_I$. The gate voltage of a thyristor near the light-emitting thyristor $T_0$ is lowered most, and the gate voltage of each subsequent thyristor rises as it is remote from the thyristor $T_0$. This can be expressed as follows:

$$V_{G0} < V_{G+1} = V_{G-1} < V_{G+2} = V_{G-2} \qquad (1)$$

The difference among these voltages can be set by properly selecting the values of the load resistor $R_L$ and the interactive resistor $R_I$.

It is known that the turn-on voltage $V_{ON}$ of the three-terminal light-emitting thyristor is a voltage that is higher than the gate voltage by the diffusion potential $V_{dif}$ as shown in the following formula.

$$V_{ON} \approx V_G + V_{dif} \qquad (2)$$

Consequently, by setting the voltage applied to the anode to a level higher than this turn-on voltage $V_{ON}$, the light-emitting thyristor may be turned on.

In the state where the light-emitting thyristor $T_0$ is turned on, the next transfer clock $\phi 1$ is raised to a high level voltage $V_H$. Although this transfer clock $\phi 1$ is applied to the light-emitting thyristors $T_{+1}$ and $T_{-2}$ simultaneously, only the light-emitting thyristor $T_{+1}$ can be turned on by setting the high-level voltage $V_H$ to the following range.

$$V_{G-2} + V_{dif} > V_H > V_{G+1} + V_{dif} \qquad (3)$$

By doing this, the light-emitting thyristors $T_0$ and $T_{+1}$ are turned on simultaneously. When the transfer clock $\phi 3$ is lowered to a low level, the light-emitting thyristors $T_0$ is turned off, and this completes transferring ON state.

In this manner, by connecting between the gate electrodes of each light-emitting thyristors with the resistor network in the self-scanning light-emitting element array, it is possible for a light-emitting thyristor to have a transfer function. Based on the principle described above, the ON state of the light-emitting thyristor is sequentially transferred by setting the high-level voltage of the transfer clocks $\phi 1$, $\phi 2$ and $\phi 3$ in such a manner as to overlap sequentially and slightly with each other, that is, the light-emitting point is sequentially transferred. In this way, the self-scanning light-emitting array according to the present invention is accomplished.

In this self-scanning light-emitting array chip, three bonding pads for transfer clock pulses $\phi 1$, $\phi 2$ and $\phi 3$, and one bonding pad for the supply voltage $V_{GK}$ are required per chip.

FIG. 3 shows an equivalent circuit diagram of a second fundamental structure of the self-scanning light-emitting array. This self-scanning light-emitting array uses a diode as means for electrically connecting the gate electrodes of light-emitting thyristors to each other. The light-emitting thyristors . . . $T_{-2}$, $T_{-1}$, $T_0$, $T_{+1}$, $T_{+2}$ . . . are arrayed in one line, the gate electrodes thereof being designated by . . . $G_{-2}$, $G_{-1}$, $G_0$, $G_{+1}$, $G_{+2}$ . . . . $R_L$ shows a load resistor for the gate electrode. The diodes to obtain electrical interaction are designated by ... $D_{-2}$, $D_{-1}$, $D_0$, $D_{+1}$, $D_{+2}$ .... $V_{GK}$ shows the supply voltage. Each of two transfer clock ($\phi_1$, $\phi_2$) lines 1, 2 is alternately connected to the anode electrode of each light-emitting thyristor.

The operation of this self-scanning light-emitting array will now be described. Assume that the transfer clock $\phi 2$ is at a high level, and the light-emitting thyristor $T_0$ is turned on. At this time, the voltage of the gate electrode $G_0$ is lowered to a level near zero volts due to the characteristic of the three-terminal light-emitting thyristor. Assuming that the supply voltage $V_{GK}$ is 5 volts, the gate voltage of each light-emitting thyristor is determined by the network consisting of the load resistors $R_L$ and the diodes ... $D_{-2}$, $D_{-1}$, $D_0$, $D_{+1}$, $D_{+2}$ .... The gate voltage of a thyristor near the light-emitting thyristor $T_0$ is lowered most, and the gate voltage of each subsequent thyristor rises as it is remote from the thyristor $T_0$.

The voltage reducing effect works only in the rightward direction from the light-emitting thyristor $T_0$ due to the unidirectionality and asymmetry of diode characteristics. That is, the gate electrode $G_{+1}$ is set at a higher voltage with respect to the gate electrode $G_0$ by a forward rise voltage $V_{dif}$ of the diode, while the gate electrode $G_{+2}$ is set at a higher voltage with respect to the gate electrode $G_{+1}$ by a forward rise voltage $V_{dif}$ of the diode. On the other hand, current does not flow in the diode $D_{-1}$ on the left side of the light-emitting thyristor $T_0$ because the diode $D_{-1}$ is reverse-viased. As a result, the gate electrode $G_{-1}$ is at the same potential as the supply voltage $V_{GK}$.

Although the next transfer clock $\phi 1$ is applied to the nearest light-emitting thyristor $T_{+1}$, $T_{-1}$; $T_{+3}$, $T_{-3}$; and so on, the thyristor having the lowest turn-on voltage among them is $T_{+1}$, whose turn-on voltage is approximately the gate voltage of $G_{+1}+V_{dif}$, about twice as high as $V_{dif}$. The thyristor having the second lowest turn-on voltage is $T_{+3}$, about four times as high as $V_{dif}$. The turn-on voltage of the thyristors $T_{-1}$ and $T_{-3}$ is about $V_{GK}+V_{dif}$.

It follows from the above discussion that by setting the high-level voltage of the transfer clock $\phi 1$ to a level about twice to four times as high as $V_{dif}$, only the light-emitting thyristor $T_{+1}$ can be turned-on to perform a transfer operation.

In this self-scanning light-emitting element array, two bonding pads for the transfer clocks $\phi 1$ and $\phi 2$, and one bonding pad for the supply voltage $V_{GK}$ are required per chip.

FIG. 4 shows an equivalent circuit diagram of a third fundamental structure of the self-scanning light-emitting array. The light-emitting element array comprises switching elements ... $T_{-1}$, $T_0$, $T_{+1}$, $T_{+2}$ ... and writing light-emitting elements ... $L_{-1}$, $L_0$, $L_{+1}$, $L_{+2}$ .... These switching elements and writing light-emitting elements consist of three-terminal light-emitting elements, respectively.

An example is shown in which a diode connection is used as the structure of a portion of switching elements. The gate ... $G_{-1}$, $G_0$, $G_{+1}$, ... of the switching elements are connected to the gates of the writing light-emitting elements. A write signal $S_{in}$ is applied to all of the anode of the writing light-emitting elements.

In the following, the operation of this self-scanning light-emitting array will be described. Assuming that the transfer element $T_0$ is turned on, the voltage of the gate electrode $G_0$ lowers below the supply voltage $V_{GK}$ (5 volts is assumed herein) and to almost zero volts. Consequently, if the voltage of the write signal $S_{in}$ is higher than the diffusion potential (about 1 volt) of the pn junction, the light-emitting element $L_0$ can be turned into a light-emission state.

On the other hand, the voltage of the gate electrode $G_{-1}$ is about 5 volts, and the voltage of the gate electrode $G_{+1}$ is about 1 volt. Consequently, the write voltage of the light-emitting element $L_{-1}$ is about 6 volts, and the write voltage of the light-emitting element $L_{+1}$ is about 2 volts. It follows from this that the voltage of the write signal $S_{in}$, which can write only in the light-emitting element $L_0$ is a range of about 1-2 volts. When the light-emitting element $L_0$ is turned on, that is, in the light-emitting state, the voltage of the line 4 for the write signal $S_{in}$ is fixed to about 1 volt. Thus, an error of selecting other light-emitting elements can be prevented.

Light emission intensity is determined by the amount of current fed to the write signal $S_{in}$, an image can be written at any desired intensity. In order to transfer the light-emitting state to the next light-emitting element, it is necessary to first turn off the element that is emitting light by temporarily reducing the voltage of the write signal $S_{in}$ down to zero volts.

In this self-scanning light-emitting element array, three bonding pads $\phi 1$, $\phi 2$, $\phi 3$, one bonding pad for the supply voltage $V_{GK}$, and one bonding pad for the write signal $S_{in}$ are required per chip.

As described above, several bonding pads per chip may control many light-emitting points in the self-scanning light-emitting element array, so that it has a merit of almost no increasing of the number of bonding pads for even high-density image. It has also characteristic of being able to narrow the width of a chip (i.e., the length of a short side) for a high-density image by devising the arrangement of bonding pads in a chip, for example by locating bonding pads at the both ends of a chip, which is possible because the number of pads is originally less. Consequently, the number of chips acquired from one wafer may be increased so that a fabrication cost becomes low.

Where the width of a self-scanning light-emitting element array chip is lower than 0.2 mm, the problem is caused such that the chip is broken during the assembling of an optical writing head, because GaAs material used for a substrate of the chip is fragile, resulting in insufficient strength of the chip.

DISCLOSURE OF THE INVENTION

An object of the present invention is to provide a self-scanning light-emitting element array chip structured on a substrate using Si to resolve the above described problem.

Another object of the present invention is to provide an optical writing head using such a self-scanning light-emitting element array chip, furthermore an optical printer.

A self-scanning light-emitting element array chip according to the present invention comprises a Si substrate, and a self-scanning light-emitting element array including pnpn layers formed on the Si substrate, or comprises a Si substrate, a lattice mismatching buffer layer formed on the Si substrate, and a self-scanning light-emitting element array including pnpn layers formed on the lattice mismatching buffer layer.

It is preferable that the width of the chip is in a range of 0.03 mm-0.3 mm. If the chip width is smaller than 0.03 mm, then chip dividing is difficult, while larger than 0.3, the number of chips per unit are acquired from a wafer is decreased due to the increasing of the chip width.

It is further preferable that the chip width is in a range of 0.05 mm-0.2 mm.

It is also preferable that the length of the chip is in a range of 2 mm-100 mm. If the chip length is shorter than 2 mm, then a handling for shorter chips becomes difficult, and while longer than 100 mm, yield becomes worse because the number of chips acquired from a Si wafer is decreased.

It is further preferable that the chip length is in a range of 5 mm-20 mm.

It will be easily understood for those who skilled in the art that the combination of the chip width and chip length described above is preferable in view of a chip handling and the number of chips to be acquired.

BRIEF DESCRIPTION OF THE DRAWINGS

FIG. 2 is an equivalent circuit diagram of a first fundamental structure of the self-scanning light-emitting array.

FIG. 3 is an equivalent circuit diagram of a second fundamental structure of the self-scanning light-emitting array.

FIG. 4 is an equivalent circuit diagram of a third fundamental structure of the self-scanning light-emitting array.

FIG. 5 is a schematic cross-sectional view depicting a light-emitting thyristor according to the present invention.

FIG. 6 is a graph showing the results of flexural strength of two types of chips measured by means of a four-point bending method.

BEST MODE FOR CARRYING OUT THE INVENTION

EMBODIMENT 1

Figure 1:
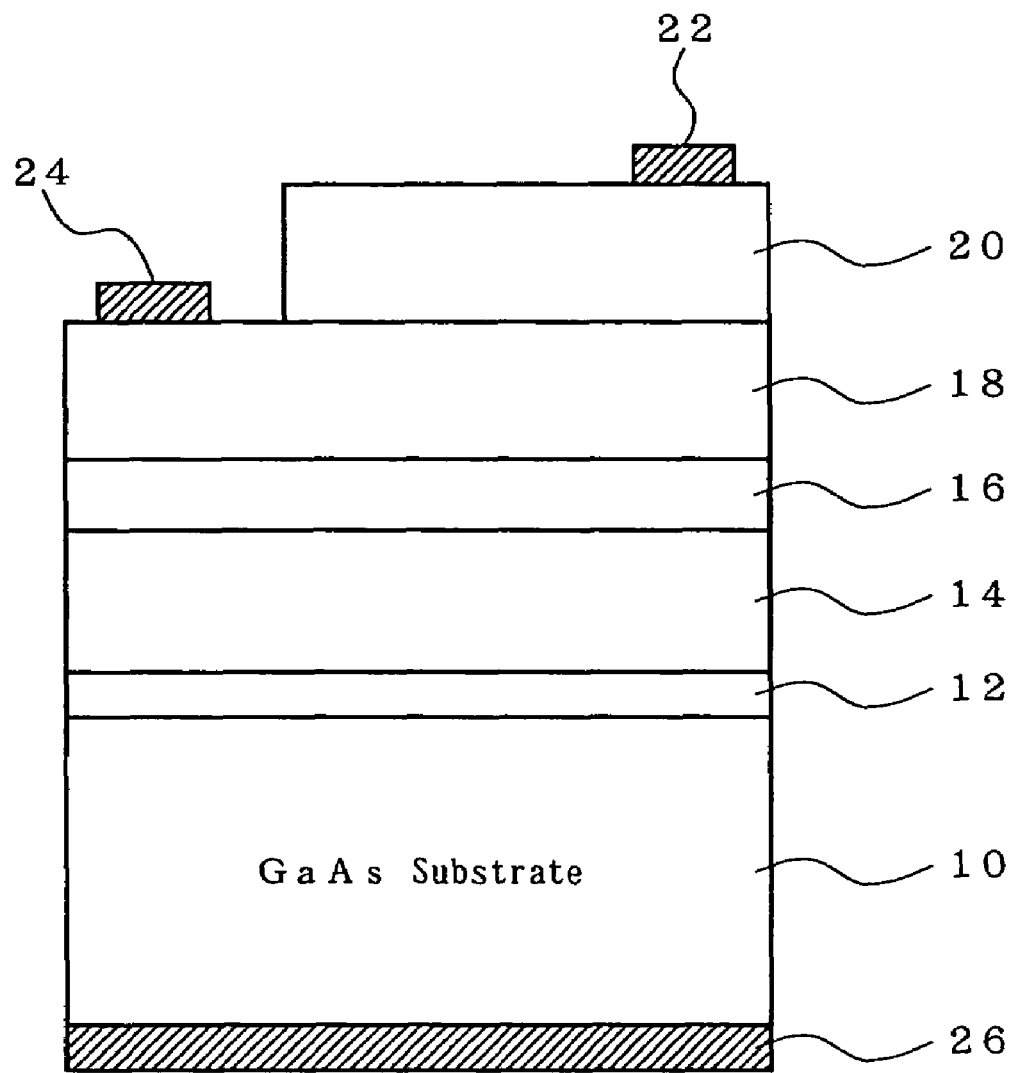
FIG. 1 is a schematic cross-sectional view depicting a conventional light-emitting thyristor.

A plurality of self-scanning light-emitting element array, each size thereof on a wafer having a size of about 5.4 mm (length)×about 0.2 mm (width), are formed in a pnpn epitaxial layer of AlGaAs double hetero-structure deposited on a Si substrate.

FIG. 5 is a schematic cross-sectional view depicting one light-emitting element, i.e., a light-emitting thyristor having such a structure. A lattice mismatching buffer layer 32 is formed on a Si substrate 30. The lattice mismatching layer is formed for the purpose of preventing the substrate from being warped when a film having a lattice constant different from that of the Si substrate is formed on the Si substrate. A strained-layer super lattice structure of InGaAs/GaAs is used as the lattice mismatching buffer layer. On the lattice mismatching buffer layer 32, successively stacked are an n-type AlGaAs layer 14, a p-type AlGaAs layer 16, an n-type AlGaAs layer 18, and a p-type AlGaAs layer 20 in this order. On the AlGaAs layer 20 provided is an anode electrode 22, on the AlGaAs layer 18 a gate electrode 24, on the bottom surface of the GaAs substrate a cathode electrode 26.

A light-emitting thyristor using not a Si substrate but a GaAs substrate in the structure shown in FIG. 5 is fabricated for comparison with a light-emitting thyristor using a Si substarate. Both of the substrates have 0.6 mm thick while wafer processing. After the thyristors is fabricated on the wafer, the bottom surface of the substrate is ground to 0.3 mm thick by using a grinder of #1200 grain size, and the wafer is diced by a dicing saw into a plurality of thyristor chips each thereof has a predetermined size. The width of a diced chip is 0.17 mm because the thickness of a blade used for dicing is 0.03 mm. The flexural strength of these two types of chips are measured by means of a four-point bending method. The measured result is shown in FIG. 6. In the figure, the abscissa designates a bending force $f_b(N)$, and the ordinate a probability of failure (a probability of chip breaking) F(x)%.

For comparison, a thyristor sample (chip) using a GaAs substrate which has a width corresponding that of two normal chips is diced, which has 0.37 mm width after dicing and 0.4 mm repeated width before dicing, and is measured to estimate the bending strength thereof.

In FIG. 6, it is appreciated that each bending strength of the two chips of 0.17 mm width and 0.37 mm width both thereof are based on GaAs substrate is substantially proportional to its chip width. On the other hand, it is understood that on the condition F(x)=50%, the chip based on a Si substrate has a bending strength substantially four times that of the chip based on GaAs substrate.

Subsequently, the above-described three types of chips are arranged on an optical writing head mounting carrier by means of a die bonding machine to adhere them thereto by electrical conducting paste and fix them thereto by baking. Each rate of destruction for these three types of chips, 12000 chip samples being prepared for each type, is shown in Table 1.

TABLE 1

| Substrate | Chip Width | Number of Samples | Number of Broken Chip | Rate of Destruction |
|---|---|---|---|---|
| GaAs | 0.17 mm | 12000 | 62 | 0.52% |
|  | 0.37 mm | 12000 | 10 | 0.08% |
| Si | 0.17 mm | 12000 | 0 | 0.00% |

The rates of destruction are 0.52% for the 0.17 mm width chip based on a GaAs substrate, 0.08% for the 0.37 mm width chip based on a GaAs substrate, and 0.00% (there is no broken chips) for the 0.17 mm width chip based on a Si substrate, respectively. It is conceived that the difference of these rates of destruction corresponds to the integration of product of the probability of failure F(x) for a given bending force $f_b$ and the probability distribution Q(x) of force applied during a die bonding process and baking process.

As a simple model, assuming the following model;

$$Q(f_b=2N)=0.1$$

$$Q(f_b=0)=0.9$$

(this model means that the force of 2N (Newton) is applied only one time in possible ten times, and the force is not applied nine times in possible ten times), the rate of destruction for chips may be substantially explained. Depending on this model, the rate of destruction for the chip based on a Si substrate may be estimated to $3 \times 10^{-6}$, which is small by a factor of 1000 compared with the chip based on a GaAs substrate having the same width. When these chips are used for an optical writing head, about 60 chips are required to be arrayed for an optical writing head for an A3 size paper sheet. Assuming that the rate of destruction for the chip is x, the probability P in which there are no broken chips per head is $P=(1-x)^{60}$. The probability is about 73% for the 0.17 mm width chip, and about 95% for the 0.37 mm width chip. In this manner, chip breaking for the 0.17 mm width chip is occurred at a rate of one chip per four heads, so that the fabrication of an optical writing head is difficult.

In this embodiment, the experimental results have shown for the case that the grinder of #1200 very fine grain size has used during the grinding process. It has already known that the strength of fragile material such as GaAs depends substantially on scratches in the bottom surface of a substrate caused while grinding. Consequently, the strength of a chip is largely varied depending on grinding conditions. While the strength of a chip may be increased by using a grinder of further fine grain size, a limitation is existed for using a grinder of an excess fine grain size, because a very low grinding speed is required. It is conceivable that a thinner wafer is used from the beginning for omitting a grinding process, although this is difficult for a GaAs substrate in view of its strength.

A self-scanning light-emitting element array chip may have an extremely narrow width, so that there is such a possibility that the chip cost may be reduced. However, a number of light-emitting points should be arrayed in one line, so that the chip length becomes more than 5 mm resulting an extremely slender shape. Consequently, a chip is easily broken, which causes a limitation for narrowing the width of a chip. From a point of view described above, a chip having less than 2 mm width based on a Si substrate may be fabricated in a preferable yield.

In the embodiment, the strained-layer super lattice structure of InGaAs/GaAs is provided on the Si substrate as a lattice mismatching buffer layer, and AlGaAs is epitaxially grown on the strained-layer super lattice structure. However, another structure may also be used for a lattice mismatching buffer layer, and the film to be grown is not limited to AlGaAs, but III-V compound semiconductor (B, Al, Ga or In for III group element and N, P, As or Sb for V group element) or II-VI compound semiconductor (Zn or Cd for II group element and O, S, Se or Te for VI group element) may be used.

It is also possible that components are formed in an epitaxial layer grown on a GaAs substrate, subsequently a large part of the GaAs substrate is removed by grinding or chemical etching, and the resultant structure is adhered to a Si substrate. That is, an advantageous effect of the present invention is obtained so long as Si is used for the material of a substrate.

A self-scanning light-emitting element array chip having described-above structure may be manufactured by forming a self-scanning light-emitting element array including pnpn layers on a GaAs substrate, removing the GaAs substrate, adhering a Si substrate to the portion where the GaAs substrate has been removed, grinding the Si substrate, and dividing the resultant structure into a plurality of self-scanning light-emitting element array chips.

EMBODIMENT 2

A chip having the size of 0.17 mm (width)×5.4 mm (length)×0.3 mm (thickness) and using a Si substrate has been illustrated in the embodiment 1.

As described in BACKGROUND ART, the number of bonding pads has been extremely reduced by using a self-scanning light-emitting element array in an optical writing head. For example, the number of bonding wires has decreased from about 15000 to 1300 for a light-emitting element array of 1200 dpi (dot per inch) in an optical writing head for A3 size paper sheet, the light-emitting element array having been fabricated by arranging a plurality of self-scanning light-emitting element array chips each thereof includes 256 light-emitting points.

However, the number of die bonding processes for arranging light-emitting elements array chips is the same as that in the prior art. In order to make this processing time short, it is necessary that the length of a chip is extended to reduce the number of chips per writing head. As a conventional GaAs substrate is mechanically fragile, a longer chip may be easily broken. Also, a large diameter of wafer using a GaAs substrate is difficult to be manufactured, so that longer chips cause a problem such that the number of chips acquired from one wafer is reduced.

In order to avoid this problem, a self-scanning light-emitting element array is formed on a Si substrate to fabricate chips each having a substrate of 0.3 mm thick and a length of 16.2 mm which is three times that of the chip in the embodiment 1. While an optical writing head has been manufactured by way of trial using described-above chips, chip breaking has not been caused. The number of chips per head has been reduced to ⅓ that in the embodiment 1, so that the time required for a die bonding process has been reduced to about ½.5 that in the embodiment 1.

Si is harder material than GaAs, resulting in less chipping during a dicing process, so that high speed dicing is possible. This is particularly effective to a self-scanning light-emitting element array which should be structured by a number of slender chips divided from one wafer.

EMBODIMENT 3

An incline of a chip surface is desired to be as small as possible when an optical writing head is manufactured, because the incline of a chip surface is reflected to the displacement of light spots in a sub-scanning direction. In order to avoid this, it is preferable that the thickness of a chip is to be thinner. As a chip width becomes narrower, the surface of a chip will be inclined if a chip does not have a thin thickness. In order to decrease the degree of incline of a chip, it is preferable that the height of a chip is smaller than the width thereof. Therefore, the Si substrate of 0.6 mm thick is ground to 0.1 mm thick by a grinder. The small thickness like this has not affected die bondings and not caused chip breaking.

As the thickness of a chip becomes thinner, the degree of the influence of a chip incline is decreased. A standard deviation of displacement of light spots in a sub-scanning direction is decreased to one third that of a Si substrate of 0.3 mm thick.

According to the present embodiment, the distance between the upper surface which is a generating source of heat and bottom surface of a chip is made short, resulting in the reducing of a thermal resistance thereof to suppress the temperature increasing of a chip due to light emission.

While a conventional GaAs substrate of 0.3 mm thick has had a heat resistance of about 1000K/W, a heat resistance of a Si substrate of 0.1 mm thick has reduced to about 400K/W due to an effect of a thermal resistivity of Si which is two times that of GaAs in addition to the decreasing of a thermal resistance. Therefore, if the chip based on a Si substrate is operated at an average power of 10 mW/chip, the temperature is increased by about 4° C., while the temperature of a conventional chip based on a GaAs substrate is increased by about 10° C. This temperature increasing is not uniformly generated within a chip, resulting in a specific temperature distribution to cause a distribution of the amount of light of a chip. Therefore, the improvement of a thermal resistance is led to the improvement of the distribution of the amount of light.

EMBODIMENT 4

By using an approach for depositing a GaAs epitaxial film on a part of a Si substrate via a lattice mismatching buffer layer, a driver circuit is formed on a Si substrate and a light-emitting element array is formed on an GaAs layer, the driver circuit and the light-emitting element array being connected to each other. In this structure, a light-emitting element array chip having less bonding pads may be monolithically implemented like a self-scanning light-emitting array chip. However, the driver circuits the number thereof is equal to that of the light-emitting elements are required, so that the chip area becomes large.

By using a self-scanning light-emitting element array as a light-emitting element array in this manner, only three driver circuits for $\phi 1$, $\phi 2$ and $S_{in}$ are required in the self-scanning light-emitting element shown in FIG. 4, for example. As a result, the chip area is not increased even if the driver circuits are included in the chip.

In the present embodiment, therefore, a self-scanning light-emitting element array including pnpn layers is formed on a part of a Si substrate via a lattice mismatching layer, and several driver circuits are formed on the Si substrate.

Figure 7:
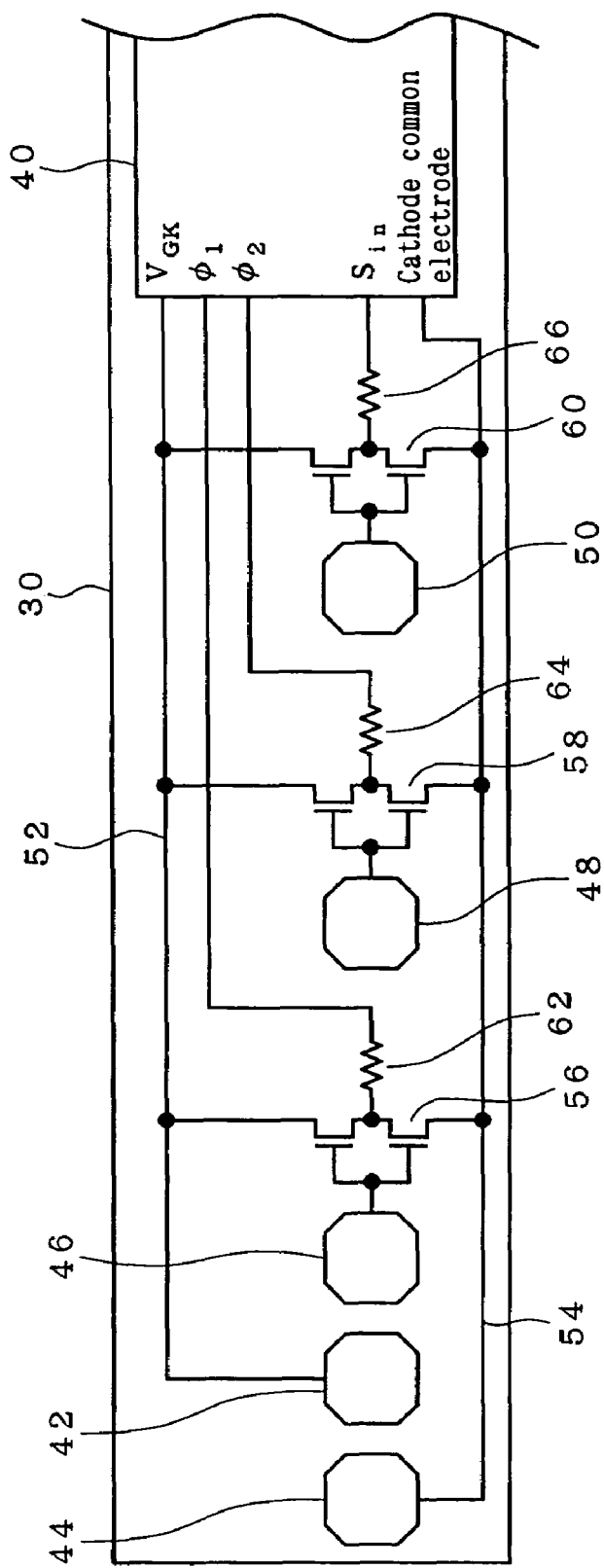
FIG. 7 is a diagram showing a structure of a self-scanning light-emitting element array including driver circuits.

FIG. 7 shows a structure of a self-scanning light-emitting element array chip thus manufactured. A self-scanning light-emitting element array 40 including pnpn layers is formed on a part of Si substrate 30 via a lattice mismatching layer. On the Si substrate 30, provided are a bonding pad 42 for a power supply $V_{DD}$, a bonding pad 44 for a power supply $V_{SS}$, a bonding pad 46 for $\phi 1$, a bonding pad 48 for $\phi 2$, and a bonding pad 50 for $S_{in}$.

A power supply $V_{DD}$ line 52 extending from the bonding pad 42 for the power supply $V_{DD}$ is connected to a $V_{GK}$ terminal of the self-scanning light-emitting element array 40. A power supply $V_{SS}$ line 54 extending from the bonding pad for the power supply $V_{SS}$ is connected to a cathode common electrode of the self-scanning light-emitting element array 40. Between the power supply $V_{DD}$ line 52 and the power supply $V_{SS}$ line 54, formed are a CMOS driver 56 for $\phi 1$, a CMOS driver 58 for $\phi 2$, and a CMOS driver 60 for $S_{in}$. An input terminal of each driver is connected to each bonding pad. An output terminal of the driver 56 is connected to the $\phi 1$ terminal of the self-scanning light-emitting element array 40 through a resistor 62, an output terminal of the driver 58 is connected to the $\phi 2$ terminal through a resistor 64, and an output terminal of the driver 60 is connected to the $S_{in}$ terminal through a resistor 66.

In this manner, only three drivers for $\phi 1$, $\phi 2$ and $S_{in}$ are required, so that the chip area is not increased even if driver circuits are included in the chip.

EMBODIMENT 5

An optical writing head using a plurality of self-scanning light-emitting element array chips described above, and an optical printer using such an optical printer head will now be described.

Figure 8:
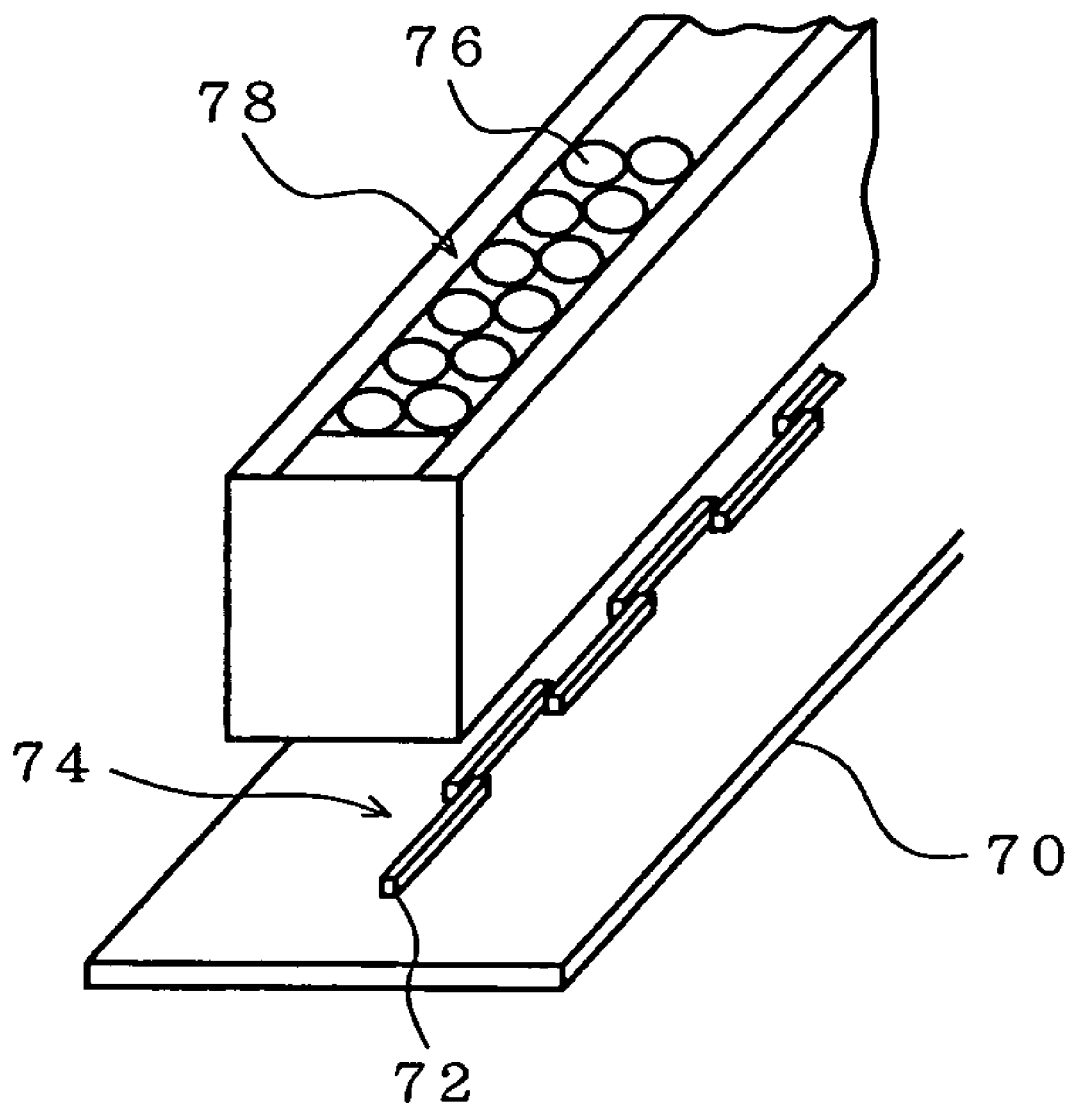
FIG. 8 is a perspective view of a main portion of an optical writing head.

FIG. 8 shows a perspective view of a main portion of an optical writing head. The optical writing head comprised a self-scanning light-emitting element array 74 structured by arranging a plurality of self-scanning light-emitting element array chips 72 in a zigzag manner on a mounting carrier 70, and an erect image, unity magnification, lens array 78 structured by arranging a plurality of an erect image, unity magnification, lenses (rod lenses) 76. The light emitted from the light-emitting element array 74 is converged by means of the lens array 78 to be projected onto a photosensitive drum (not shown).

Figure 9:
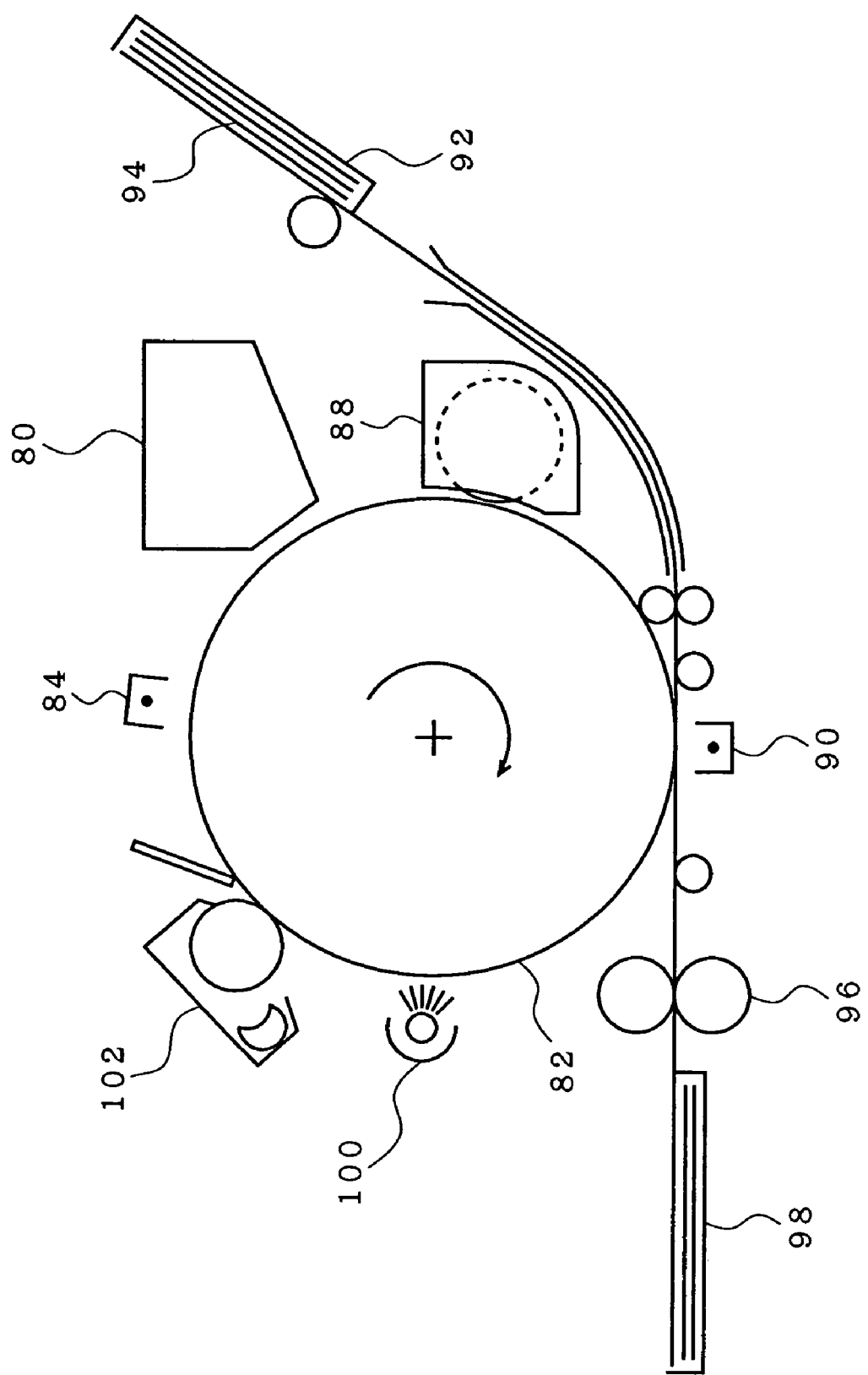
FIG. 9 is a diagram showing the structure of an optical printer including an optical writing head.

FIG. 9 shows the structure of an optical printer including an optical writing head 80. A photoconductive material (photosensitive material) such as amorphous Si is provided on the surface of a cylindrical photosensitive drum 82, which is rotated at the printing speed. The surface of the photosensitive material is uniformly charged with an electrostatic charger 84. Then, light corresponding to a dot image being printed with an optical writing head 80 is projected onto the surface of the photosensitive material to neutralize the charge on the area to which the light is projected. Next, a developer 88 deposits the toner on the photosensitive material surface in accordance with the charged pattern on the photosensitive material surface. The transfer unit 90 transfers the toner on a paper sheet 94 fed from a cassette 92. The toner on the paper sheet is thermally fixed by the heat applied by a fixer 96, and the paper is sent to a stacker 98. Upon completion of transfer, on the other hand, the charge on the drum is neutralized over the entire surface with an erasing lamp 100, and the remaining toner is removed by a cleaner 102.

INDUSTRIAL APPLICABILITY

According to the present invention, a self-scanning light-emitting element array chip may be realized, which having following advantageous effects. (1) The strength of a chip may be increased compared with a conventional chip based on a GaAs substrate. (2) As the strength of a chip may be increased, the width of a chip may be narrowed, resulting in the increased number of chips acquired from one wafer and the further decreased cost of a chip.

An optical writing head and optical printer of the present invention have following advantageous effects. (1) As the number of chips acquired from one wafer is increased due to the narrowing of the chip width, the cost of a chip may be decreased to provide an optical writing head and optical printer in lower cost. (2) As a longer-size chip may be used, the speed of die bonding process may be improved to manufacture an optical writing head in a short time and increase the productivity of an optical printer. (3) The thickness of a chip may be thinner, the degree of the incline of a chip may be decreased to manufacture an optical writing head having a uniform distribution of the amount of light. Furthermore, as the temperature increasing of a chip during light emitting may be suppressed due to the thinning of a chip, the distribution of the amount of light of an optical writing head may be improved, resulting in the improvement of the capability of an optical printer.

The invention claimed is:

1. A self-scanning light-emitting element array chip, comprising:
   a Si substrate;
   a lattice mismatching buffer layer formed directly on the Si substrate, the buffer layer including a strained-layer super lattice; and
   a self-scanning light-emitting element array including pnpn layers formed on the lattice mismatching buffer layer.

2. The self-scanning light-emitting element array chip according to claim 1, further comprising:
   a driver circuit formed an the Si substrate.

3. The self-scanning light-emitting element array chip according to claim 1 or 2, wherein the width of the chip is in a range of 0.03 mm-0.3 mm.

4. The self-scanning light-emitting element array chip according to claim 3, wherein the width of the chip is in a range of 0.05 mm-0.2 mm.

5. The self-scanning light-emitting element array chip according to claim 3, wherein the length of the chip is in a range of 2 mm-100 mm.

6. The self-scanning light-emitting element array chip according to claim 5, wherein the length of the chip is in a range of 5 mm-20 mm.

7. The self-scanning light-emitting element array chip according to claim 5, wherein the height of the chip is smaller than the width thereof.

8. The self-scanning light-emitting element array chip according to claim 1 or 2, wherein the pnpn layers include III-V compound semiconductor consisting of B, Al, Ga or In for III group element and N, P, As or Sb for V group element.

9. The self-scanning light-emitting element array chip according to claim 1 or 2, wherein the pnpn layers Include II-VI compound semiconductor consisting of Zn or Cd for II group element and O, S, Se or Te for VI group element.

10. An optical writing heed, comprising:
a self-scanning light-emitting element array structured by arranging the self-scanning light-emitting element array chips of claim 1 or 2, and
a lens array for projecting light from the self-scanning light-emitting element array.

11. An optical printer comprising:
an optical writing head of claim 10; and
a photosensitive drum onto which light from the self-scanning light-emitting element array is projected.

* * * * *